(12) United States Patent
Bilgic et al.

(10) Patent No.: US 11,009,575 B2
(45) Date of Patent: May 18, 2021

(54) METHOD FOR SIMULTANEOUS TIME-INTERLEAVED MULTISLICE MAGNETIC RESONANCE IMAGING

(71) Applicant: THE GENERAL HOSPITAL CORPORATION, Boston, MA (US)

(72) Inventors: Berkin Bilgic, Boston, MA (US); Kawin Setsompop, Charlestown, MA (US); Daniel Polak, Cambridge, MA (US); Huihui Ye, Charlestown, MA (US); Lawrence Wald, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 776 days.

(21) Appl. No.: 15/592,851

(22) Filed: May 11, 2017

(65) Prior Publication Data
US 2017/0328971 A1    Nov. 16, 2017

Related U.S. Application Data

(60) Provisional application No. 62/334,991, filed on May 11, 2016.

(51) Int. Cl.
*G01R 33/561* (2006.01)
*G01R 33/483* (2006.01)

(52) U.S. Cl.
CPC ...... *G01R 33/4835* (2013.01); *G01R 33/5611* (2013.01); *G01R 33/5617* (2013.01)

(58) Field of Classification Search
CPC ............ G01R 33/4835; G01R 33/5615; G01R 33/561
See application file for complete search history.

(56) References Cited

U.S. PATENT DOCUMENTS

| | | | |
|---|---|---|---|
| 7,446,526 B2 * | 11/2008 | Cunningham | G01R 33/246 324/307 |
| 9,770,187 B2 * | 9/2017 | Umeda | A61B 5/055 |
| 9,846,217 B2 * | 12/2017 | Lin | G01R 33/5608 |
| 10,185,013 B2 * | 1/2019 | Park | G01R 33/5614 |
| 2008/0116891 A1 * | 5/2008 | van der Kouwe | G01R 33/561 324/312 |
| 2017/0010340 A1 | 1/2017 | Eichner et al. | |

(Continued)

OTHER PUBLICATIONS

Power independent of number of slices (PINS) radiofrequency pulses for low-power simultaneous multislice excitation, Norris et al., Magnetic Resonance in Medicine 2011 (Year: 2011).*

(Continued)

*Primary Examiner* — Alesa Allgood
(74) *Attorney, Agent, or Firm* — Quarles & Brady LLP

(57) ABSTRACT

Methods for reducing scan time in magnetic resonance imaging ("MRI"), particularly when imaging three-dimensional image volumes, using a simultaneous time-interleaved multislice ("STIMS") acquisition are described. The unused time in each repetition time ("TR") period is exploited to provide an additional reduction in encoding time for a three-dimensional acquisition (e.g., a 3D whole brain coverage). Groups of spatially interleaved slices are excited in a single TR, with the excitation and acquisition of the groups of slices being interleaved in time.

18 Claims, 5 Drawing Sheets

(56) References Cited

U.S. PATENT DOCUMENTS

2017/0199259 A1* 7/2017 Beck .................. G01R 33/5611

OTHER PUBLICATIONS

Wave-CAIPI for highly accelerated 3D imaging, Bilgic et al., Magnetic Resonance in Medicine 2015 (Year: 2015).*

Bilgic B, Xie L, Dibb R, et al. "Rapid Multi-Orientation Quantitative Susceptibility Mapping." Neuroimage. Jan. 15, 2016; 125: pp. 1131-1141. doi:10.1016/j.neuroimage.2015.08.015.

Bilgic B, Chatnuntawech I, Langkammer C, Setsompop K. "Sparse methods for Quantitative Susceptibility Mapping." 2015 SPIE, Proc SPIE. 2015;9597, pp. 959711-1-959711-10. doi:10.1117/12.2188535.

Bilgic B, Gagoski BA, Cauley SF, Fan AP, Polimeni JR, Grant PE, Wald LL, Setsompop K. "Wave-CAIPI for highly accelerated 3D imaging." Magnetic Resonance in Medicine 73:2152-2162 (2015).

Boyacioglu R, Schulz J, Norris D. "Multiband Echo-Shifted Echo Planar Imaging" Magnetic Resonance in Medicine 77:1981-1986 (2017).

Boyd S, Parikh N, Chu E, Peleato B, Eckstein J. "Distributed Optimization and Statistical Learning via the Alternating Direction Method of Multipliers." Found. Trends® Mach. Learn. 2010;3: pp. 1-126. doi: 10.1561/2200000016.

Buehrer M, Pruessmann KP, Boesiger P, Kozerke S. "Array compression for MRI with large coil arrays." Magnetic Resonance in Medicine 57: pp. 1131-1139 (2007). doi: 10.1002/mrm.21237.

Conolly S, Nishimura DG, Macovski A, Glover GH. "Variable-rate selective excitation." J Magn Reson. 1988;78(3):440-458.

Curtis A, Bilgic B, Setsompop K, Menon R, Anand C. "Wave-CS: Combining wave encoding and compressed sensing." In: Proc. Intl. Soc. Mag. Reson. Med. 23. ; 2015. p. 0082.

Gagoski B, Bilgic B, Eichner C. "RARE/turbo spin echo imaging with simultaneous multislice Wave-CAIPI." Magn Reson Med. Mar. 2015 ; 73(3): pp. 929-938. doi:10.1002/mrm.25615.

Goldstein T, Osher S. "The split Bregman method for L1 regularized problems." SIAM J. Imaging Sci. 2009;2: pp. 1-21.

Kaaouana T, de Rochefort L, Samaille T, Thiery N, Dufouil C, Delmaire C, Dormont D, Chupin M. "2D harmonic filtering of MR phase images in multicenter clinical setting: toward a magnetic signature of cerebral microbleeds." Neuroimage 2015;104:287-300. doi: 10.1016/j.neuroimage.2014.08.024.

Li W, Wu B, Liu C. "Quantitative susceptibility mapping of human brain refects spatial variation in tissue composition." Neuroimage. Apr. 15, 2011; 55(4): 1645-1656. doi:10.1016/j.neuroimage.2010.11.088.

Liu G, Sobering G, Duyn JH, Moonen CTW. "A functional MRI technique combining principles of echo-shifting with a train of observations(PRESTO)." Magn Reson Med. 1993;30:764-768.

Liu T, Spincemaille P, de Rochefort L, Kressler B, Wang Y. "Calculation of susceptibility through multiple orientation sampling (COSMOS): a method for conditioning the inverse problem from measured magnetic field map to susceptibility source image in MRI." Magnetic Resonance in Medicine 61:196-204 (2009).

Ma Y-J, Liu W, Zhao X, et al. "3D interslab echo-shifted FLASH sequence for susceptibility weighted imaging." Magnetic Resonance in Medicine 76:222-228 (2016).

Moonen CTW, Liu G, van Gelderen P, Sobering G. "A fast gradient-recalled MRI technique with increased sensitivity to dynamic susceptibility effects." Magn Reson Med. 1992;26:184-189.

Norris et al. "Power Independent of Number of Slices (PINS) Radiofrequency Pulses for Low-Power Simultaneous Multislice Excitation" Magnetic Resonance in Medicine 66:1234-1240 (2011).

Pruessmann K, Weiger M, Scheidegger MB, Boesiger P. "SENSE: sensitivity encoding for fast MRI." Magnetic Resonance in Medicine 42:952-962 (1999).

Smith S. "Fast robust automated brain extraction." Human Brain Mapping 17:143-155(2002).

Sun H, Wilman AH. "Background field removal using spherical mean value filtering and Tikhonov regularization." Magnetic Resonance in Medicine 71:1151-1157 (2014). doi: 10.1002/mrm.24765.

Sung K, Hargreaves BA. "High-frequency subband compressed sensing MRI using quadruplet sampling." Magnetic Resonance in Medicine 70:1306-1318 (2013). doi: 10.1002/mrm.24592.

Uecker M, Virtue P, Ong F, Murphy M, Alley M, Vasanawala S, Lustig M. "Software Toolbox and Programming Library or Compressed Sensing and Parallel Imaging." In: ISMRM Workshop on Data Sampling and Image Reconstruction, Sedona. ; 2013.

Uecker M, Lai P, Murphy M, Virtue P, Elad M, Pauly JM, Vasanawala S, Lustig M. "ESPIRiT—an eigenvalue approach to autocalibrating parallel MRI: Where SENSE meets GRAPPA." Magnetic Resonance in Medicine 71:990-1001 (2014).

* cited by examiner

METHOD FOR SIMULTANEOUS TIME-INTERLEAVED MULTISLICE MAGNETIC RESONANCE IMAGING

CROSS-REFERENCE TO RELATED APPLICATIONS

This application claims the benefit of U.S. Provisional Patent Application Ser. No. 62/334,991, filed on May 11, 2016, and entitled "Simultaneous Time Interleaved Multi-Slice Acquisition for Efficient Imaging."

STATEMENT REGARDING FEDERALLY SPONSORED RESEARCH

This invention was made with government support under EB019437 awarded by the National Institutes of Health. The government has certain rights in the invention.

BACKGROUND

Volumetric magnetic resonance imaging ("MRI") involves exciting and encoding magnetic spins in a three-dimensional field-of-view ("FOV"), which typically yields a high signal-to-noise ratio ("SNR") because all of the image voxels in the 3D volume contribute to noise averaging. Two volumetric imaging sequences that are routinely used in clinical MRI are the 3D gradient-echo ("3D-GRE") and the 3D magnetization prepared rapid gradient-echo ("3D-MPRAGE") pulse sequences.

3D-GRE offers detailed tissue contrast based on an apparent transverse relaxation, T2*, mechanism, and is a workhorse pulse sequence for susceptibility-weighted imaging ("SWI"), which yields good image contrast based on the difference in precession speed of magnetic spins. Tissue phase data derived from a 3D-GRE acquisition form the basis for quantitative susceptibility mapping ("QSM"), which is an imaging technique that solves for the underlying tissue magnetic susceptibility. QSM has applications in quantifying tissue iron concentration and venous oxygen saturation. Because SWI and QSM require long echo times ("TEs") to build up phase contrast, such acquisitions with large volume coverage (e.g., whole brain coverage) are inherently long.

As such, there remains a need to reduce the total scan time to improve patient comfort and throughput, as well as to minimize sensitivity of the acquisitions to subject motion. Rapid 3D-GRE imaging would also enable data acquisition at finer spatial resolution within a clinically feasible time frame.

3D-MPRAGE is one of the most common pulse sequences used for T1-weighted imaging. This acquisition is based on a rapid 3D-GRE pulse sequence with a magnetization preparation module to provide excellent image contrast between gray matter and white matter. In addition to yielding structural information with whole brain coverage, 3D-MPRAGE has applications in neuroimaging studies because it can provide good image contrast for cortical segmentation. Within a single repetition time ("TR"), 3D-MPRAGE involves playing an inversion preparation pulse, followed by the encoding of an entire data segment (e.g., an entire $k_x$-$k_z$ plane at a fixed $k_y$ position in 3D k-space).

While 3D-MPRAGE allows for rapid data acquisition, no encoding is performed during the inversion time ("TI") interval to allow spin relaxation for optimal tissue contrast. A conventional 3D-MPRAGE acquisition will therefore require a long acquisition time. Improving the acquisition efficiency of 3D-MPRAGE would provide improved patient compliance and robustness to subject motion, while also enabling higher spatial resolution scans that can provide finer detail and segmentation performance.

In a method referred to as interslab echo-shift, multiple contiguous slabs are excited and encoded within a single TR period for efficient 3D-GRE. In this technique, an echo signal is generated for each individual slab and these signals are stacked in an echo train to allow for the encoding of several slabs at the same time.

Because the entire field-of-view is divided into multiple, contiguous slabs that are then excited and encoded separately, slab boundary artifacts will be present when using this interslab echo-shift technique. In addition, by dividing the field-of-view into smaller, contiguous slabs reduces parallel imaging capabilities in the slice direction because the aliasing voxels become closer to each other in accelerated acquisitions.

SUMMARY OF THE DISCLOSURE

The present disclosure addresses the aforementioned drawbacks by providing a method for producing multiple images of a subject with a magnetic resonance imaging (MRI) system. Data are acquired from a volume-of-interest in a subject with an MRI system. The MRI system performs a pulse sequence in which during a single repetition time of the pulse sequence a first group of slices is excited and first data from the first group of slices are acquired at a first echo time, and a second group of slices that is different from the first group of slices is excited and second data from the second group of slices are acquired at a second echo time. At least some of the slices in the first group of slices are spatially interleaved with at least some of the slices in the second group of slices. A first group of images is reconstructed from the first data, and a second group of images is reconstructed from the second data. The first group of images and the second group of images collectively depict the volume-of-interest.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Described here are methods for reducing scan time in magnetic resonance imaging ("MRI"), particularly when imaging three-dimensional image volumes, using a simultaneous time-interleaved multislice ("STIMS") acquisition. In the methods described in the present disclosure, the unused time in each repetition time ("TR") period is exploited to provide an additional reduction in encoding time for a three-dimensional acquisition (e.g., a 3D whole brain coverage).

The time interleaving techniques described in the present disclosure are combined with a simultaneous multislice ("SMS") acquisition to achieve significant acceleration of a 3D gradient-echo ("3D-GRE"), 3D magnetization prepared rapid gradient-echo ("3D-MPRAGE") acquisitions, and other acquisitions where multiple RF pulses are used for each slice acquisition, including spin-echo-based acquisitions, such as a turbo spin-echo ("TSE") sequence. By exploiting the unused time in 3D-GRE imaging where a long TE is typically required to build up contrast, different segments of the field-of-view can be excited and encoded as multiple echo signals within each TR. This time-interleaving leads to substantial reduction in the total scan time required for imaging over larger volumes, such as imaging for whole-brain coverage. Similarly, the unused inversion time duration in 3D-MPRAGE acquisitions, or other acquisitions that include a magnetization preparation, can be used for encoding different segments of the field-of-view to provide scan time reduction. The excitation, and magnetization preparation, scheme described in the present disclosure implements generally comb-shaped slice groups to avoid slab boundary artifacts, while preserving the large distance between aliasing voxels in accelerated acquisitions.

The methods described in the present disclosure offer advantages over previous techniques, such as the interslab echo-shift technique. For example, when a comb-shaped excitation of slice groups is generally used (i.e., such that sets of non-spatially adjacent slices are simultaneously excited in an interleaved fashion), boundary artifacts are eliminated. In addition, the separation of aliased voxels is preserved in the slice direction, which enables accelerated acquisitions. As a result, high quality parallel imaging can be implemented without slab boundary issues. The time-interleaved acquisitions described in the present disclosure provide acceleration along an orthogonal axis (i.e., the slice encoding axis) to in-plane acceleration techniques, and can be combined with other parallel imaging techniques including SENSE, GRAPPA, 2D-CAIPIRINHA, wave-CAIPI, and so on.

Figure 1:
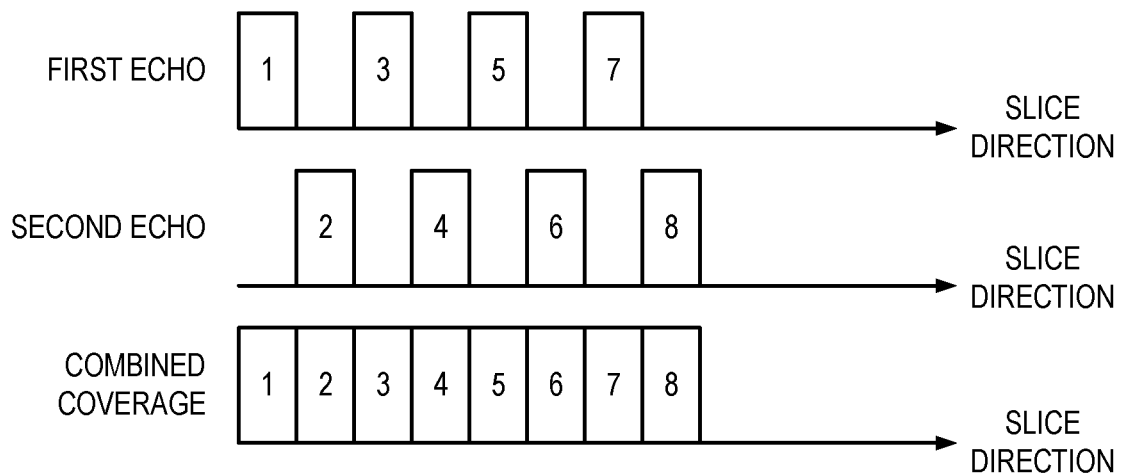
FIG. 1 depicts an example of two different spatially interleaved groups of slices that are acquired at two different echo times and that collectively span a volume-of-interest and in which none of the slices in the groups are spatially contiguous.

In the methods described in the present disclosure, multiple echoes are acquired in each TR period, and different sets of slices contribute to each echo signal. As one example, an interleaving factor of two can be used, such that two echoes will be acquired in each TR period. To this end, a first set of slices will contribute to a first echo, and a second set of slices will contribute to a second echo in each TR period. The first and second set of slices preferably each contain slices that are not spatially adjacent such that boundary artifacts between the slices are eliminated. As one example, the first set of slices can include odd-numbered slices and the second set of slices can include even-numbered slices, such that the union of the first and second set of slices contains a set of spatially contiguous slices, as shown in FIG. 1.

Figure 2:
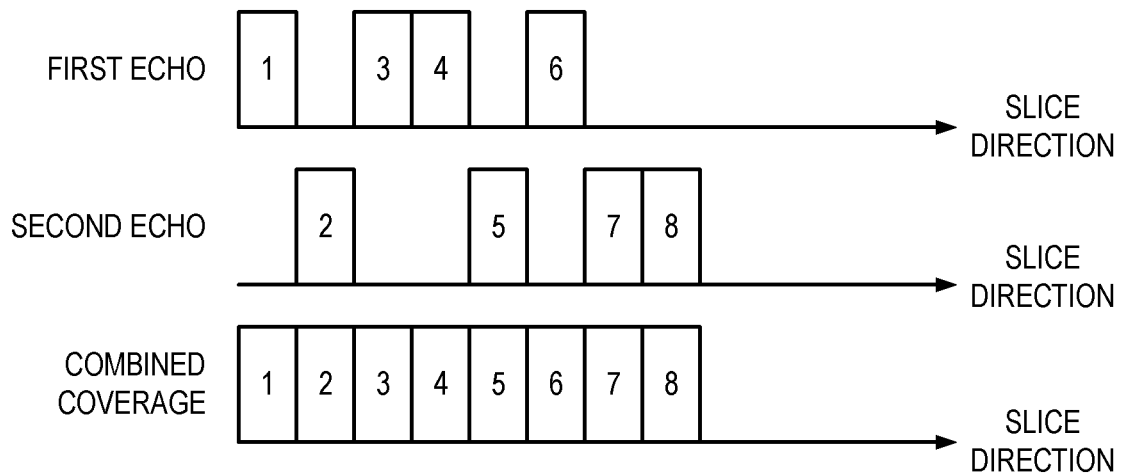
FIG. 2 depicts an example of two different spatially interleaved groups of slices that are acquired at two different echo times and that collectively span a volume-of-interest and in which some of the slices in the groups are spatially contiguous and randomly assigned.

In some examples, the slices assigned to each set of slices can be randomly selected, as shown in FIG. 2. In these instances, the slices can be assigned such that the union of the various sets of slices spans the entire volume-of-interest and such that no slice is imaged more than once in a given TR period.

Figure 3:
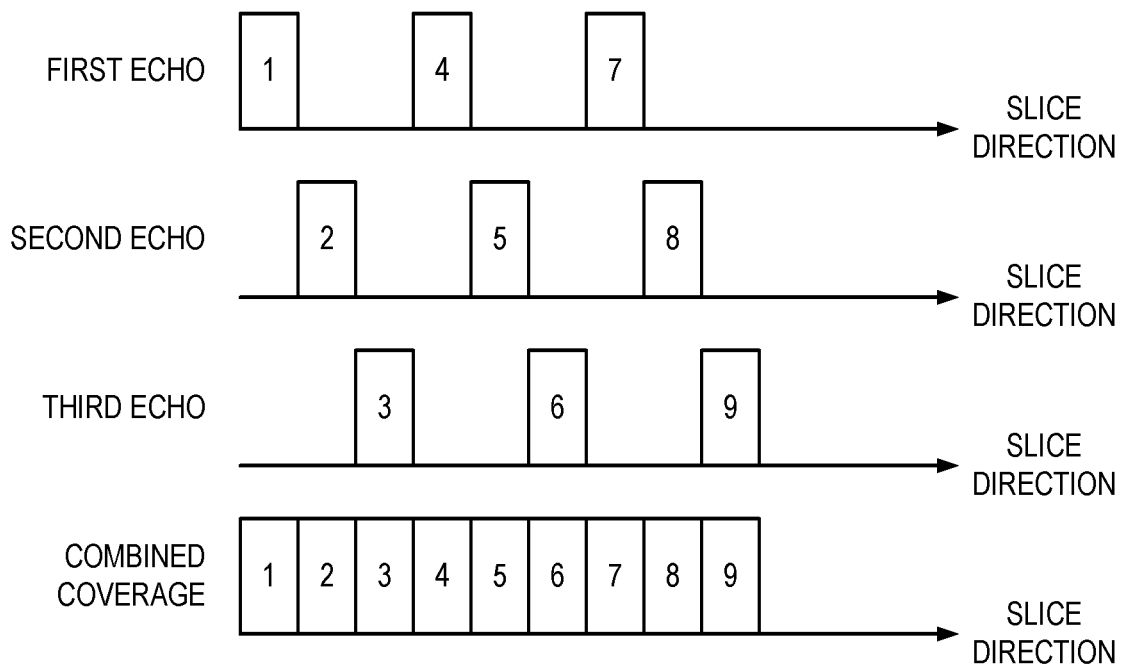
FIG. 3 depicts an example of three different spatially interleaved groups of slices that are acquired at three different echo times and that collectively span a volume-of-interest and in which none of the slices in the groups are spatially contiguous.
Figure 4:
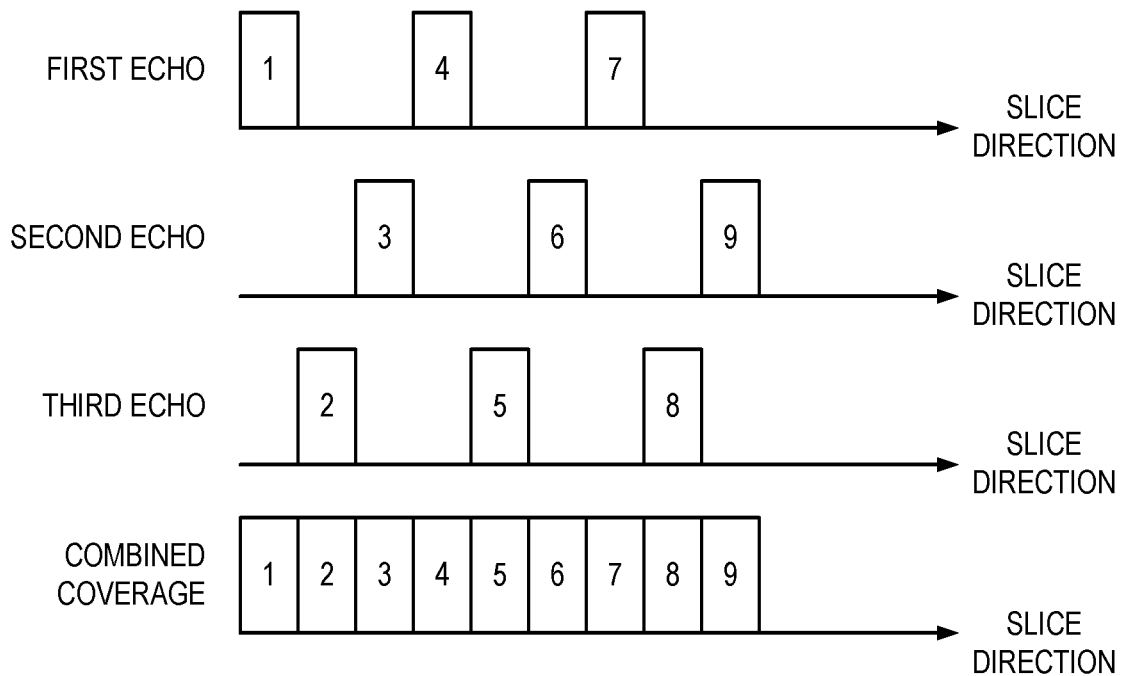
FIG. 4 depicts another example of three different spatially interleaved groups of slices that are acquired at three different echo times and that collectively span a volume-of-interest and in which none of the slices in the groups are spatially contiguous.

Higher accelerations can be achieved by increasing the number of echoes to acquire in each TR period. Thus, in some embodiments more than two echoes can be acquired in each TR period. As an example, an interleaving factor of three can be used, such that three echoes are acquired in each TR period. In these instances, the first set of slices (e.g., slices 1, 4, 7, . . . ) will contribute to the first echo, the second set of slices (e.g., slices 2, 5, 8, . . . ) will contribute to the second echo, and the third set of slices (e.g., slices 3, 6, 9, . . . ) will contribute to the third echo, as shown in FIG. 3. Other combinations of slices in each set of slices, as well as the order in which the slice sets are interleaved, can be implemented. For instance, in the preceding example, the third set of slices (e.g., slices 3, 6, 9, . . . ) could contribute to the second echo and the second set of slices (e.g., slices 2, 5, 8, . . . ) could contribute to the third echo, as shown in FIG. 4.

Figure 5:
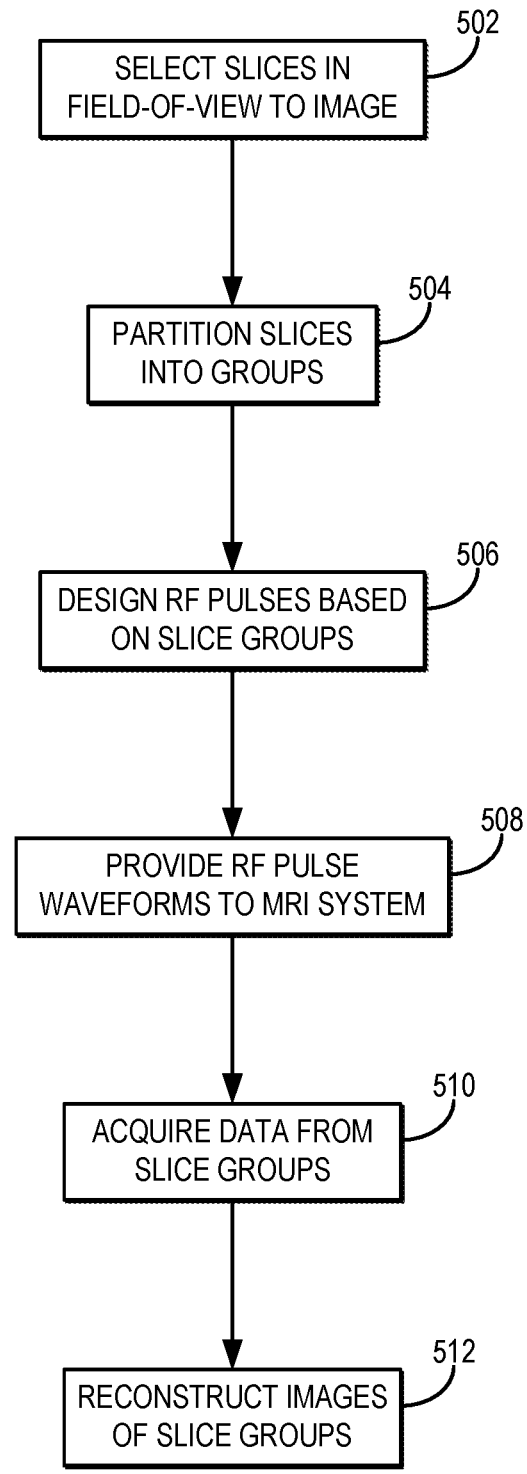
FIG. 5 is a flowchart setting forth the steps of an example method for reducing scan time in magnetic resonance imaging (MRI) using simultaneous time-interleaved multislice acquisitions.

Referring now to FIG. 5, a flowchart is illustrated as setting forth the steps of an example method for reducing scan time in MRI using a simultaneous time-interleaved multislice acquisition. The method includes selecting a number of slices, or slabs, in a field-of-view to be imaged, as indicated at step 502. For instance, a field-of-view defining a volume to be imaged (e.g., a volume associated with whole-brain coverage) can be selected first and a number of slices, or slabs, spanning that volume can subsequently be selected. The selected slices, or slabs, are then partitioned into two or more groups or sets of slices, as indicated at step 504. As described above, the slices are partitioned into groups based on an interleaving factor, which, in part, defines how many groups the slices should be partitioned into. The groups of slices preferably contain at least some slices that are not contiguous, such that the slices in different groups of slices are spatially interleaved with each other. In some implementations, none of the slices in a group will be contiguous with each other; rather, a gap equal to one or more slice thicknesses will be spaced between each slice in the group.

Each group of slices will be separately excited by an appropriately designed RF pulse, such that each slice in the group will be simultaneously excited. Thus, an RF pulse is designed or otherwise selected for each group of slices, as indicated at step 506. Each RF pulse can be a different multiband or other suitable RF pulse for simultaneously exciting multiple different slices. As one example, a power independent of number of slices ("PINS") pulse design can be used. As another example, a MultiPINS pulse design can be used, such as the one described in co-pending U.S. Patent Application No. US2017/0010340, which is herein incorporated by reference in its entirety. When the imaging sequence to be used includes using magnetization preparation (e.g., in 3D-MPRAGE acquisitions), then both excitation and magnetization preparation RF pulses will be designed or otherwise selected for each group of slices.

Information about the selected groups of slices and the associated RF pulse waveforms are then provided to an MRI system to be used in a pulse sequence to acquire data from a subject, as indicated at step 508. Examples of pulse sequences that can be implemented are described below. Data are acquired using the selected pulse sequence, as indicated at step 510. In general, a different data set will be acquired for each group of slices. Images are then reconstructed from the acquired data, as indicated at step 512. Because each data set includes data from multiple simultaneously excited slices, parallel imaging reconstructions techniques known in the art can be used to reconstruct images of each individual slice while reducing or otherwise eliminating aliasing artifacts.

As described above, in some implementations the pulse sequence can be a 3D-GRE pulse sequence, in which multiple echoes are generated in each TR period, with the number of echoes being equal to the interleaving factor selected for the acquisition. That is, a different group of slices will be associated with a different echo in each TR period.

As one non-limiting example, a GRE acquisition using the methods described in the present disclosure can be implemented. RF pulses exciting odd and even numbered slices can be spaced apart by a duration of time, such as 10 ms. The two echo readouts can follow each other in time to yield an effective RF equal to the TR of the GRE acquisition plus the separation time between the RF pulses. For example, if the GRE acquisition has a TR of 40 ms, and the time separation between the two RF pulses is 10 ms, then the acquisition will have an effective TR of 50 ms.

In this example, a 5/4-fold increase in scan time results from using the longer TR. On the other hand, the slice resolution for each slice group is doubled; thus, the number of partition encoding steps can also be reduced by a factor of two. This is because of the gaps between the slices (e.g., for an acquisition with 1.5 mm slice resolution, partition encoding with only 3 mm resolution is needed to resolve each slice group). When the two factors are combined, an 8/5-fold acceleration in total imaging time is achieved. With an additional acceleration from parallel imaging techniques the overall acceleration can be further increased. For example, an additional 9-fold acceleration can be gained from using a wave-CAIPI technique, resulting in an overall acceleration factor of 14.4 that would reduce an 18 minute whole-brain GRE scan at 1 mm isotropic resolution to just 1.2 minutes. Similarly, using an interleaving factor of three instead of two, an acceleration factor of 18 could be achieved, enabling a one minute whole-brain GRE scan at 1 mm isotropic resolution.

Figure 6:
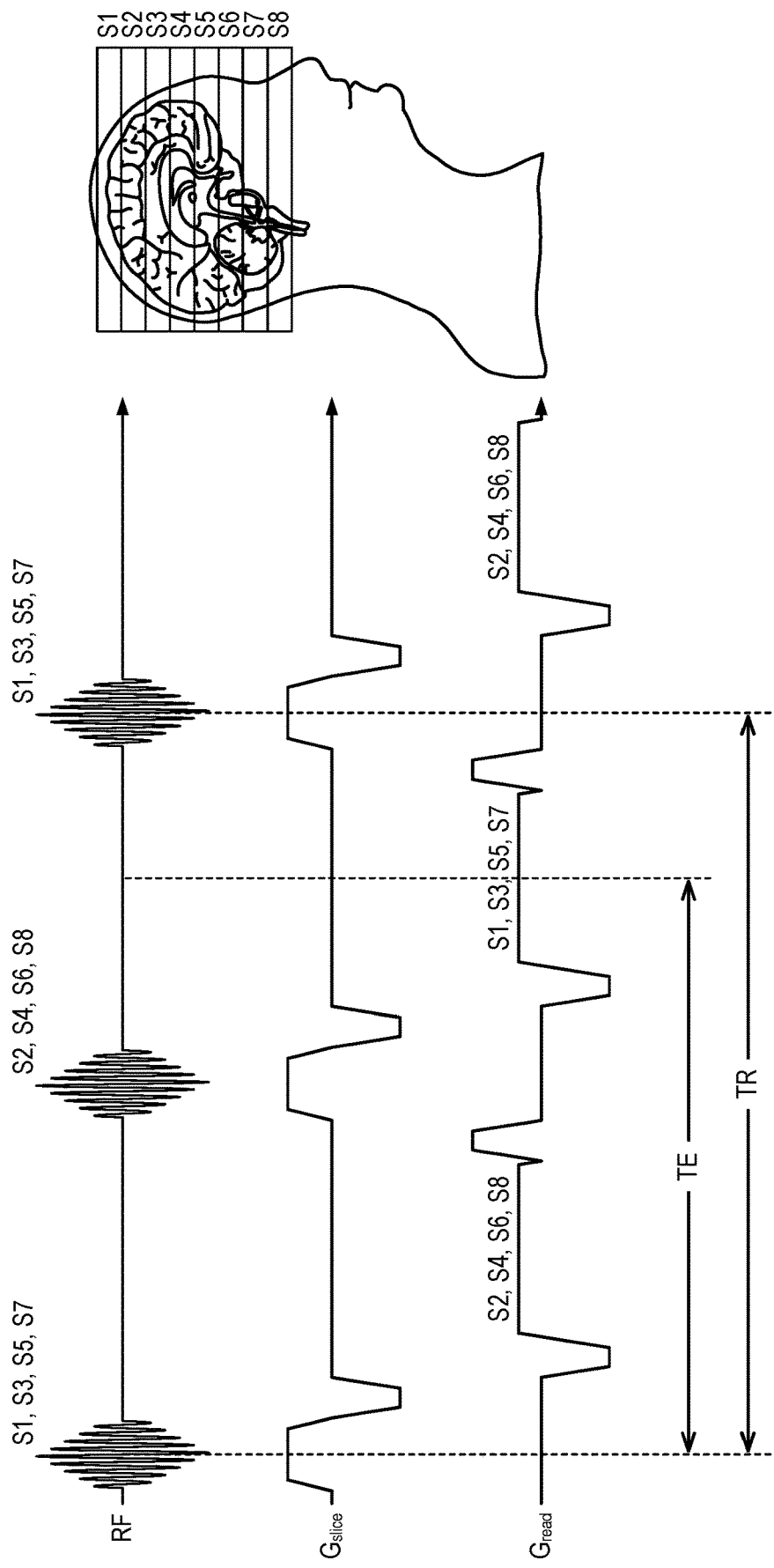
FIG. 6 is an example of a pulse sequence diagram for a 3D-GRE pulse sequence that implements a simultaneous time-interleaved multislice acquisition.

As another example, FIG. 6 illustrates a 3D-GRE pulse sequence implementing the simultaneous time-interleaved multislice acquisition techniques described in the present disclosure. In this example, echo shift gradients are applied on both $G_x$ and $G_z$ gradients, wherein the interleaving factor is 2 and MultiBand-48 excitation RF pulses with 1.5 mm slice thickness are used. In this example, the first RF pulse excites the odd slices (e.g., S1, S3, S5, and S7) of the 3D imaging volume with the signal readout echo-shifted to the second TR, while the second RF pulse excites the even slices (e.g., S2, S4, S6, and S8) with the signal readout shifted to the third TR. A comb of slices is thus acquired simultaneously, which enables desirable volumetric noise averaging while avoiding slice boundary artifacts. Moreover, the combined use of the simultaneous time-interleaved multislice acquisition with an accelerated wave-CAIPI acquisition enables controlled aliasing to be performed across the whole imaging field-of-view rather than a partial field-of-view in the slice-direction, thereby providing optimal parallel imaging performance to achieve low noise amplification and image artifact penalties. After the acquisition, two volumes (one for each slice group) can be reconstructed separately using standard wave-CAIPI reconstruction and concatenated in an interleaved fashion to generate full volumetric data.

In some other implementations, the pulse sequence can be a 3D-MPRAGE pulse sequence. As another non-limiting example, the methods described in the present disclosure can be implemented to minimize the dead time in a 3D-MPRAGE acquisition due to the magnetization preparation. An interleaving factor of two can be used with PINS, MultiPINS, or other suitable multiband inversion and excitation pulses designed to invert and excite the odd-numbered slices, followed by the even-numbered slices, in the phase encoding direction (e.g., the y-direction). Two echo trains will be acquired per TR, where the first echo train will encode a plane of $k_x$-$k_z$ frequencies belonging to the odd-numbered slices, and the second echo train will encode a plane of $k_x$-$k_z$ frequencies belonging to the even-numbered slices.

In this example, the effective resolution is doubled in the phase encoding direction (e.g., the y-direction), thus requiring only half of the phase encoding steps to be acquired, which leads to a substantial scan time reduction. The odd-numbered slices are read-out during the unused inversion period of the even-numbered slices, and vice versa.

In any instance, the pulse sequence can be designed to implement a parallel imaging or other accelerated acquisition technique. As one example, the pulse sequence can implement a wave-CAIPI technique, such as the one described in U.S. Pat. No. 8,981,776, which is herein incorporated by reference in its entirety. Wave-CAIPI generally utilizes additional gradients during the readout to improve controlled aliasing and to more fully harness coil sensitivity encoding. For instance, wave-CAIPI utilizes sinusoidal gradients during each readout period to traverse a corkscrew trajectory and to spread aliasing in all spatial directions.

As mentioned above, the methods described in the present disclosure can also be applied to pulse sequences other than 3D-GRE or 3D-MPRAGE sequences. For example, the methods can be implemented in spin-echo-based pulse sequences, such as 3D-TSE sequences.

Figure 7:
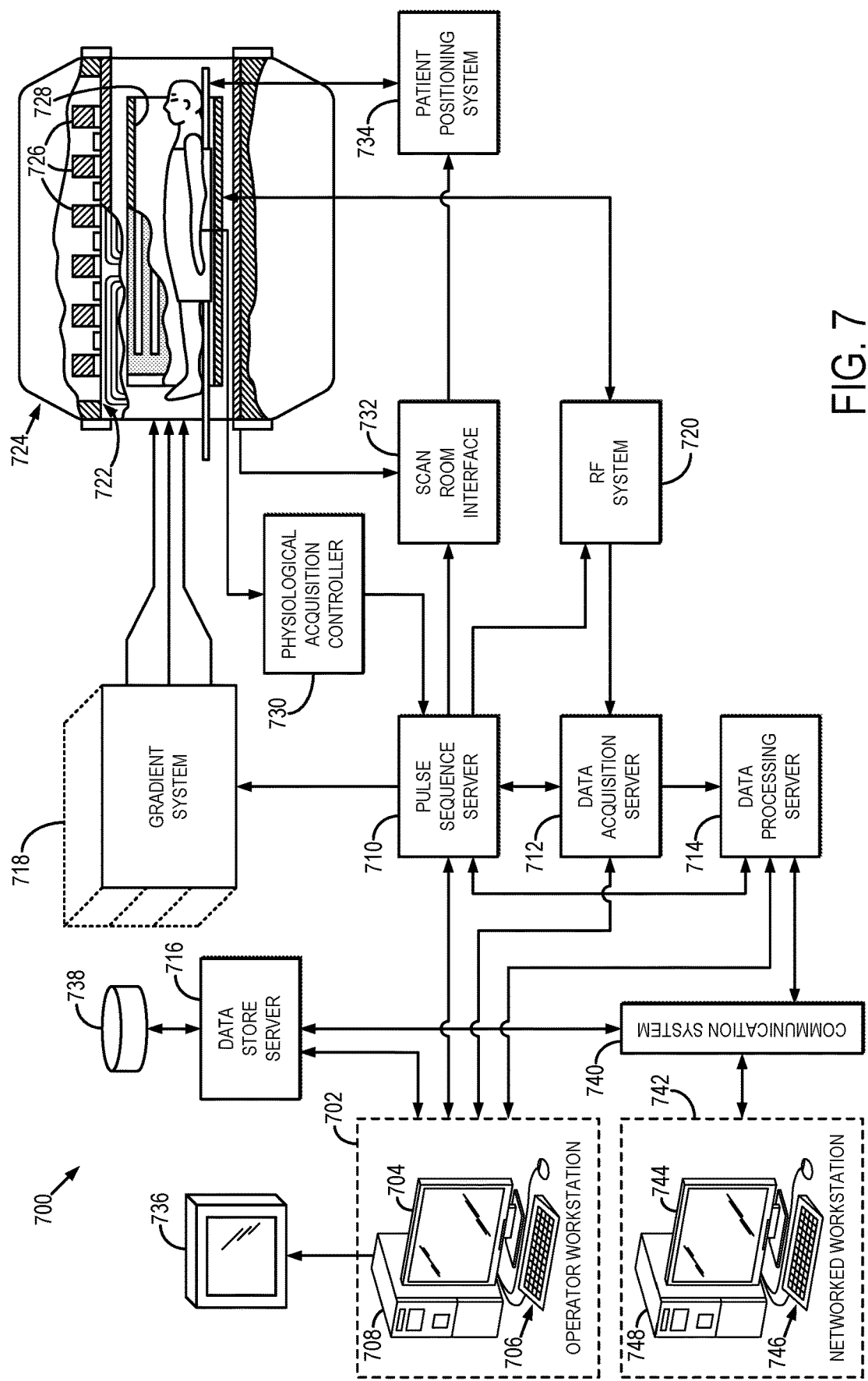
FIG. 7 is a block diagram of an example MRI system that can implement the methods described in the present disclosure.

Referring particularly now to FIG. 7, an example of an MRI system 700 that can implement the methods described here is illustrated. The MRI system 700 includes an operator workstation 702 that may include a display 704, one or more input devices 706 (e.g., a keyboard, a mouse), and a processor 708. The processor 708 may include a commercially available programmable machine running a commercially available operating system. The operator workstation 702 provides an operator interface that facilitates entering scan parameters into the MRI system 700. The operator workstation 702 may be coupled to different servers, including, for example, a pulse sequence server 710, a data acquisition server 712, a data processing server 714, and a data store server 716. The operator workstation 702 and the servers 710, 712, 714, and 716 may be connected via a communication system 740, which may include wired or wireless network connections.

The pulse sequence server 710 functions in response to instructions provided by the operator workstation 702 to operate a gradient system 718 and a radiofrequency ("RF") system 720. Gradient waveforms for performing a prescribed scan are produced and applied to the gradient system 718, which then excites gradient coils in an assembly 722 to produce the magnetic field gradients $G_x$, $G_y$, and $G_z$ that are used for spatially encoding magnetic resonance signals. The gradient coil assembly 722 forms part of a magnet assembly 724 that includes a polarizing magnet 726 and a whole-body RF coil 728.

RF waveforms are applied by the RF system 720 to the RF coil 728, or a separate local coil to perform the prescribed magnetic resonance pulse sequence. Responsive magnetic resonance signals detected by the RF coil 728, or a separate local coil, are received by the RF system 720. The responsive magnetic resonance signals may be amplified, demodulated, filtered, and digitized under direction of commands produced by the pulse sequence server 710. The RF system 720 includes an RF transmitter for producing a wide variety of RF pulses used in MRI pulse sequences. The RF transmitter is responsive to the prescribed scan and direction from the pulse sequence server 710 to produce RF pulses of the desired frequency, phase, and pulse amplitude waveform. The generated RF pulses may be applied to the whole-body RF coil 728 or to one or more local coils or coil arrays.

The RF system 720 also includes one or more RF receiver channels. An RF receiver channel includes an RF preamplifier that amplifies the magnetic resonance signal received by the coil 728 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \quad (1);$$

and the phase of the received magnetic resonance signal may also be determined according to the following relationship:

$$\varphi = \tan^{-1}\left(\frac{Q}{I}\right). \quad (2)$$

The pulse sequence server 710 may receive patient data from a physiological acquisition controller 730. By way of example, the physiological acquisition controller 730 may receive signals from a number of different sensors connected to the patient, including electrocardiograph ("ECG") signals from electrodes, or respiratory signals from a respiratory bellows or other respiratory monitoring devices. These signals may be used by the pulse sequence server 710 to synchronize, or "gate," the performance of the scan with the subject's heart beat or respiration.

The pulse sequence server 710 may also connect to a scan room interface circuit 732 that receives signals from various sensors associated with the condition of the patient and the magnet system. Through the scan room interface circuit 732, a patient positioning system 734 can receive commands to move the patient to desired positions during the scan.

The digitized magnetic resonance signal samples produced by the RF system 720 are received by the data acquisition server 712. The data acquisition server 712 operates in response to instructions downloaded from the operator workstation 702 to receive the real-time magnetic resonance data and provide buffer storage, so that data is not lost by data overrun. In some scans, the data acquisition server 712 passes the acquired magnetic resonance data to the data processor server 714. In scans that require information derived from acquired magnetic resonance data to control the further performance of the scan, the data acquisition server 712 may be programmed to produce such information and convey it to the pulse sequence server 710. For example, during pre-scans, magnetic resonance data may be acquired and used to calibrate the pulse sequence performed by the pulse sequence server 710. As another example, navigator signals may be acquired and used to adjust the operating parameters of the RF system 720 or the gradient system 718, or to control the view order in which k-space is sampled. In still another example, the data acquisition server 712 may also process magnetic resonance signals used to detect the arrival of a contrast agent in a magnetic resonance angiography ("MRA") scan. For example, the data acquisition server 712 may acquire magnetic resonance data and processes it in real-time to produce information that is used to control the scan.

The data processing server 714 receives magnetic resonance data from the data acquisition server 712 and processes the magnetic resonance data in accordance with instructions provided by the operator workstation 702. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 714 are conveyed back to the operator workstation 702 for storage. Real-time images may be stored in a data base memory cache, from which they may be output to operator display 702 or a display 736. Batch mode images or selected real time images may be stored in a host database on disc storage 738. When such images have been reconstructed and transferred to storage, the data processing server 714 may notify the data store server 716 on the operator workstation 702. The operator workstation 702 may be used by an operator to archive the images, produce films, or send the images via a network to other facilities.

The MRI system 700 may also include one or more networked workstations 742. For example, a networked workstation 742 may include a display 744, one or more input devices 746 (e.g., a keyboard, a mouse), and a processor 748. The networked workstation 742 may be located within the same facility as the operator workstation 702, or in a different facility, such as a different healthcare institution or clinic.

The networked workstation 742 may gain remote access to the data processing server 714 or data store server 716 via the communication system 740. Accordingly, multiple networked workstations 742 may have access to the data processing server 714 and the data store server 716. In this manner, magnetic resonance data, reconstructed images, or other data may be exchanged between the data processing server 714 or the data store server 716 and the networked workstations 742, such that the data or images may be remotely processed by a networked workstation 742.

The present disclosure has described one or more preferred embodiments, and it should be appreciated that many equivalents, alternatives, variations, and modifications, aside from those expressly stated, are possible and within the scope of the invention.

The invention claimed is:

1. A method for producing multiple images of a subject with a magnetic resonance imaging (MRI) system, the steps of the method comprising:
   (a) acquiring data from a volume-of-interest in a subject with an MRI system performing a pulse sequence in which during a single repetition time of the pulse sequence:
      a first group of slices is excited and first data from the first group of slices are acquired at a first echo time;
      a second group of slices that is different from the first group of slices is excited and second data from the second group of slices are acquired at a second echo time;
      wherein at least some of the slices in the first group of slices are spatially interleaved with at least some of the slices in the second group of slices;
   (b) reconstructing a first group of images from the first data;
   (c) reconstructing a second group of images from the second data; and
   wherein the first group of images and the second group of images collectively depict the volume-of-interest.

2. The method as recited in claim 1, wherein the first group of slices is excited using a first radiofrequency (RF) pulse that simultaneously excites the slices in the first group of slices, and the second group of slices is excited using a second RF pulse that simultaneously excites the slices in the second group of slices.

3. The method as recited in claim 1, wherein the pulse sequence is a gradient-echo (GRE) pulse sequence.

4. The method as recited in claim 1, wherein the pulse sequence is a spin-echo pulse sequence.

5. The method as recited in claim 2, wherein the first RF pulse is a multiband RF pulse that excites nuclear spins having resonance frequencies associated with the first group of slices and the second RF pulse is a multiband RF pulse that excites nuclear spins having resonance frequencies associated with the second group of slices.

6. The method as recited in claim 2, wherein the first RF pulse and the second RF pulse comprise power independent of number of slices (PINS) RF pulses.

7. The method as recited in claim 2, wherein the first RF pulse and the second RF pulse comprise MultiPINS RF pulses.

8. The method as recited in claim 1, wherein the first group of slices and the second group of slices each comprise slices that are not spatially contiguous with other slices in a given group of slices.

9. The method as recited in claim 8, wherein the slices in the first group of slices are spatially interleaved with the slices in the second group of slices.

10. The method as recited in claim 8, wherein the first group of slices comprises odd-numbered slices and the second group of slices comprises even-numbered slices in a series of slices that spans the volume-of-interest.

11. The method as recited in claim 1, further comprising:
    during the single repetition time of the pulse sequence:
       exciting a third group of slices that is different from the first group of slices and the second group of slices, wherein at least some of the slices in the first group of slices, the second group of slices, and the third group of slices are spatially interleaved with each other;
       acquiring third data from the third group of slices at a third echo time; and
    reconstructing a third group of images from the third data, wherein the first group of images, the second group of images, and the third group of images collectively depict the volume-of-interest.

12. The method as recited in claim 11, wherein the first group of slices, the second group of slices, and the third group of slices each comprise slices that are not spatially contiguous with other slices in a given group of slices.

13. The method as recited in claim 12, wherein a union of the first group of slices, the second group of slices, and the third group of slices comprises a series of slices that spans the volume-of-interest.

14. The method as recited in claim 13, wherein the first group of slices comprises a first slice and every third slice counted therefrom in the series of slices, the second group of slices comprises a second slice and every third slice counted therefrom in the series of slices, and the third group of slices comprises a third slice and every third slice counted therefrom in the series of slices.

15. The method as recited in claim 1, wherein the pulse sequence is a magnetization prepared rapid gradient-echo (MPRAGE) pulse sequence and further comprising during the single repetition time of the pulse sequence:
    applying a first magnetization preparation radiofrequency (RF) pulse to the first group of slices; and
    applying a second magnetization preparation RF pulse to the second group of slices.

16. The method as recited in claim 15, wherein at least one of the first data and the second data are acquired during dead time in the single repetition time following at least one of the first magnetization preparation RF pulse and the second magnetization preparation RF pulse.

17. The method as recited in claim 1, wherein at least one of the first data and the second data are acquired using a parallel imaging technique to accelerate data acquisition along at least one axis.

18. The method as recited in claim 17, wherein the parallel imaging technique is a wave-CAIPI technique.

* * * * *